United States Patent
Lai et al.

(10) Patent No.: US 7,507,612 B2
(45) Date of Patent: Mar. 24, 2009

(54) FLAT PANEL DISPLAY AND FABRICATION METHOD THEREOF

(75) Inventors: Han-Chung Lai, Taoyuan (TW); Ta-Wen Liao, Miaoli (TW)

(73) Assignee: AU Optronics Corp., Hsinchu (TW)

( * ) Notice: Subject to any disclaimer, the term of this patent is extended or adjusted under 35 U.S.C. 154(b) by 321 days.

(21) Appl. No.: 11/610,528

(22) Filed: Dec. 14, 2006

(65) Prior Publication Data

US 2007/0082435 A1    Apr. 12, 2007

Related U.S. Application Data

(62) Division of application No. 10/819,382, filed on Apr. 6, 2004, now Pat. No. 7,170,092.

(30) Foreign Application Priority Data

May 12, 2003    (TW) ............................. 92112780 A

(51) Int. Cl.
  *H01L 21/00* (2006.01)
(52) U.S. Cl. ............... 438/149; 438/151; 257/E29.151; 345/92
(58) Field of Classification Search ......... 438/149–167; 257/E29.151
See application file for complete search history.

(56) References Cited

U.S. PATENT DOCUMENTS

| | | |
|---|---|---|
| 5,153,754 A | 10/1992 | Whetten |
| 5,580,796 A | 12/1996 | Takizawa et al. |
| 5,847,781 A | 12/1998 | Ono et al. |
| 6,323,917 B1 | 11/2001 | Fujikawa et al. |
| 6,696,324 B2 | 2/2004 | Hong et al. |
| 6,888,586 B2 | 5/2005 | Yoo et al. |
| 2002/0093027 A1* | 7/2002 | Zhong et al. .................. 257/98 |
| 2002/0106825 A1 | 8/2002 | Lee et al. |
| 2002/0127887 A1* | 9/2002 | Uehara et al. ............... 438/800 |
| 2002/0135709 A1 | 9/2002 | Sung Chae et al. |
| 2004/0195574 A1* | 10/2004 | Ahn et al. ..................... 257/72 |

OTHER PUBLICATIONS

China Office Action mailed Jun. 2, 2006

* cited by examiner

*Primary Examiner*—Brook Kebede
(74) *Attorney, Agent, or Firm*—Thomas, Kayden, Horstemeyer & Risley

(57) ABSTRACT

A flat panel display and fabrication method thereof. The present invention uses four etching processes to define a second conducting layer, a doped semiconductor layer and a semiconductor layer. The first etching process is a wet etching using a first resist layer to etch the second conducting layer. The second etching process is executed with an etchant comprising oxygen to etch the doped semiconductor layer and the semiconductor layer, and the first resist layer undergoes ashing during etching so as to become a second resist layer with a channel pattern. The third etching process is another wet etching, and the second conducting layer is etched again using the second resist layer as the etching mask. The fourth etching process is executed to dry etch the doped semiconductor layer using the second resist layer as the etching mask.

10 Claims, 3 Drawing Sheets

FLAT PANEL DISPLAY AND FABRICATION METHOD THEREOF

CROSS-REFERENCE TO RELATED APPLICATION

This application is a division of U.S. patent application Ser. No. 10/819,382, filed Apr. 6, 2004.

BACKGROUND OF THE INVENTION

1. Field of the Invention

The present invention relates in general to a flat panel display (FPD) and a fabrication method thereof. In particular, the present invention relates to a flat panel display with reduced parasitic capacitance and its fabrication method.

2. Description of the Related Art

Liquid crystal display (LCD) devices are a well-known form of flat panel displays with the advantages of low power consumption, light weight, thin profile, and low driving voltage. The liquid crystal molecules change orientation when an electronic field is applied. In the display region of the LCD, an array of pixel regions is patterned by horizontally extending gate lines and vertically extending data lines. Each pixel region has a thin film transistor (TFT) and a pixel electrode. The TFT serves as a switching device.

The traditional TFT array substrate is fabricated by the following method. A gate insulating layer, an amorphous silicon layer, an n+ doped silicon layer and a metal layer (i.e. M2) are sequentially formed on a substrate with a gate thereon. The metal layer (M2) is wet etched using a first resist layer to define a data line pattern, and the edge of the patterned metal layer undercuts the first resist layer. The first resist layer is continuously used to dry etch the n+ doped silicon layer and the amorphous silicon layer. After etching the metal, n+ doped silicon, and amorphous silicon layers, the first resist layer is then ashed to become a second resist layer with a channel pattern. The second resist layer is then used to be a mask to wet etch the metal layer again, and the edge of the metal layer (M2) is cut again. The second resist layer is continuously used to dry etch the n+ doped silicon layer to define a source and a drain.

In the above-mentioned etching processes, the metal layer (M2) is wet etched twice to cut its edge. The amorphous silicon layer, however, still has the same pattern as the first resist layer. Therefore, the to-be-formed pixel electrode cannot achieve a higher pixel aperture ratio from behind the edge of the metal layer (M2) because of parasitic capacitance between the pixel electrode and the n+ doped silicon layer.

SUMMARY OF THE INVENTION

To solve the above problems, it is an object of the present invention to provide a flat panel display with lower parasitic capacitance between the pixel electrode and the n+ doped silicon layer.

It is another object of the present invention to provide a method of forming a flat panel display with shorter distance between the edges of the second metal layer and the n+ doped silicon layer.

The present invention provides a method for forming the flat panel display. A first conducting layer, such as a metal layer, comprising a gate electrode is formed on the substrate. A first insulating layer, a doped semiconductor layer and a second conducting layer, such as a metal layer, are sequentially formed on the first conducting layer and the substrate. A first resist layer is formed on the second conducting layer.

The second conducting layer undercuts the first resist layer after wet etching, and the edges of the second conducting layer and the first resist layer is at a first distance. The doped semiconductor layer and the semiconductor layer is dry etched with a etchant comprising oxygen, while the first resist layer undergoes partial ashing and is reduced to become a second resist layer having a channel pattern. The second conducting layer undercuts the second resist layer again after wet etching, therefore, the edges of the second conducting layer and the doped semiconductor layer are at a second distance, and a source electrode and a drain electrode are defined in the second conducting layer. The doped semiconductor layer is dry etched to form a source and a drain in the doped semiconductor layer.

In the above-mentioned forming method, the first distance is about 1 μm, the second distance is smaller than about 2 μm, preferably 1.5 μm. Moreover, the doped semiconductor layer and the semiconductor layer are dry etched with the etchant comprising oxygen at a flow rate of about 100-1000 sccm.

The present invention also provides a flat panel display. A first conducting layer comprising a gate electrode is disposed on a substrate. A first insulating layer is disposed on the first conducting layer and the substrate. A semiconductor layer is disposed on the first insulating layer. A doped semiconductor layer is disposed on the semiconductor layer. A second conducting layer comprising a source electrode and a drain electrode is disposed on the doped semiconductor layer. The width of the second conducting layer is smaller than that of the doped semiconductor layer, and a distance between the edges of the second conducting layer and the doped semiconductor layer is smaller than about 2 μm.

Another flat panel display with lower parasitic capacitance between the pixel electrode and the n+ doped silicon layer is provided in the present invention. A first conducting layer comprising a scan line is disposed on a substrate. A first insulating layer is disposed on the first conducting layer and the substrate. A semiconductor layer is disposed on the first insulating layer. A doped semiconductor layer comprising a data line is disposed on the semiconductor layer. A second conducting layer comprising a data line is disposed on the doped semiconductor layer. The width of the second conducting layer is smaller than that of the doped semiconductor layer, and a distance between edges of the second conducting layer and the doped semiconductor layer is smaller than about 2 μm. A second insulating layer is disposed on the data line and the first insulating layer. A pixel electrode is disposed on the second insulating layer and controlled by the scan line and the data line.

BRIEF DESCRIPTION OF THE DRAWINGS

The preferred embodiment of the invention is hereinafter described with reference to the accompanying drawings in which:

FIG. 2E is the cross section taken along cut line II-II of FIG. 1.

DETAILED DESCRIPTION OF THE INVENTION

Figure 1:
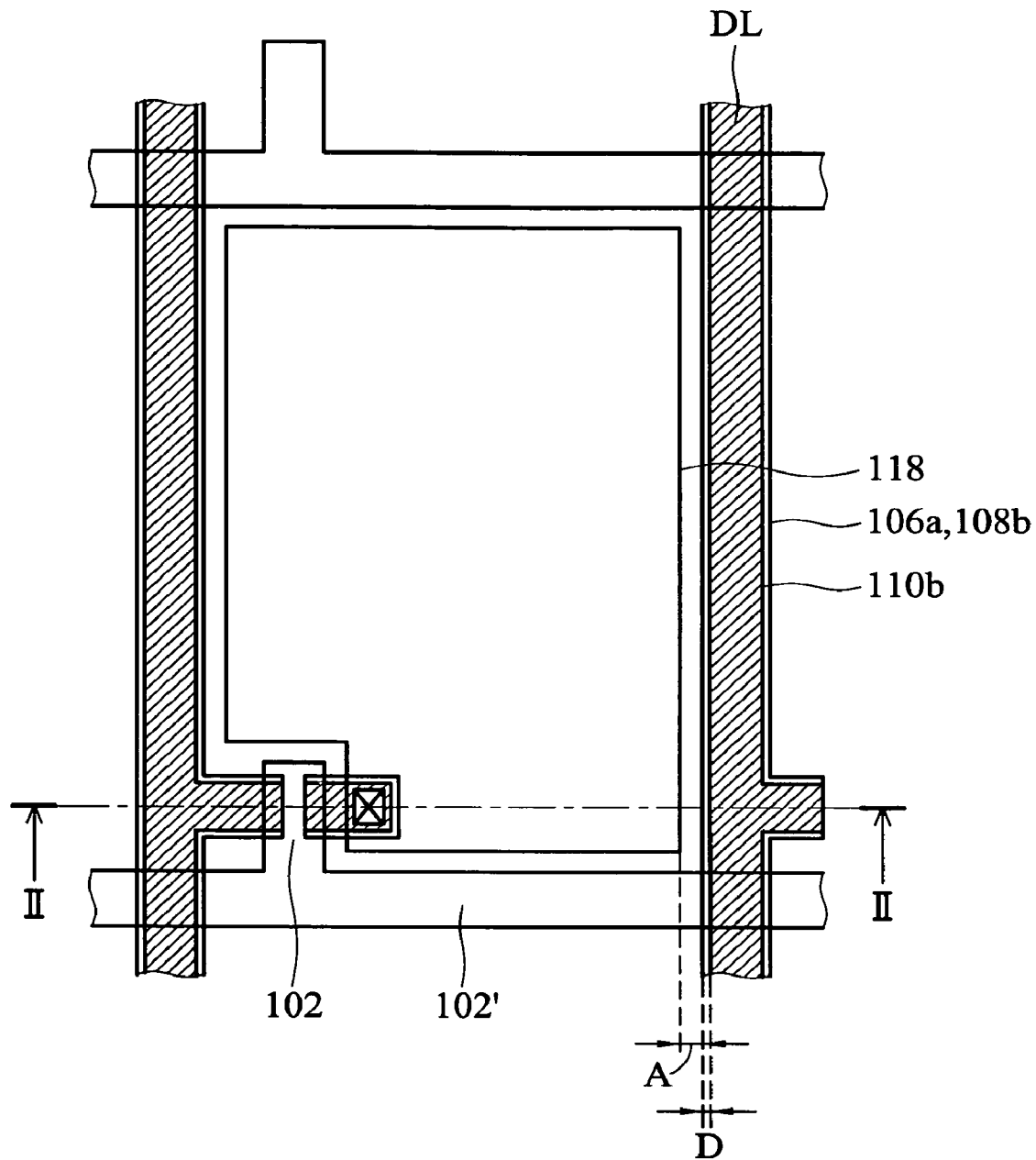
FIG. 1 is a top view of FIG. 2E showing a flat panel display of the present invention.

FIG. 1 is a top view of a flat panel display of the present invention. FIG. 2A~2E are cross sections showing a method for forming the flat panel display, wherein FIG. 2E is a cross section of II-II cut line in FIG. 1.

Figure 2A:
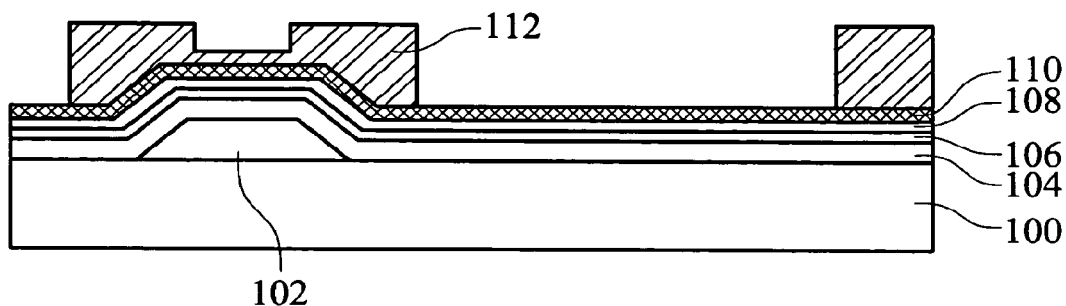
FIGS. 2A-2E are cross sections showing the method for forming the flat panel display of the present invention.

Referring to FIG. 2A, a substrate 100, such as a glass or quartz substrate, is provided. A first conducting layer, such as a metal layer, is formed on the substrate 100, and patterned to form a gate electrode 102 and a gate line 102', as shown in FIG. 1.

An insulating layer 104, a semiconductor layer 106, a doped semiconductor layer 108 and a second conducting layer 110 are sequentially formed on the substrate 100 with the gate line 102' and the gate electrode 102 thereon. A resist layer 112 with double patterns is formed on the second conducting layer 110. The insulating layer 104 can be a silicon nitride layer or a silicon oxide layer. The semiconductor layer 106 can be an amorphous layer. The doped semiconductor layer 108 can be an n type doped amorphous silicon layer. The second conducting layer 110 can be a metal layer (M2).

Figure 2B:
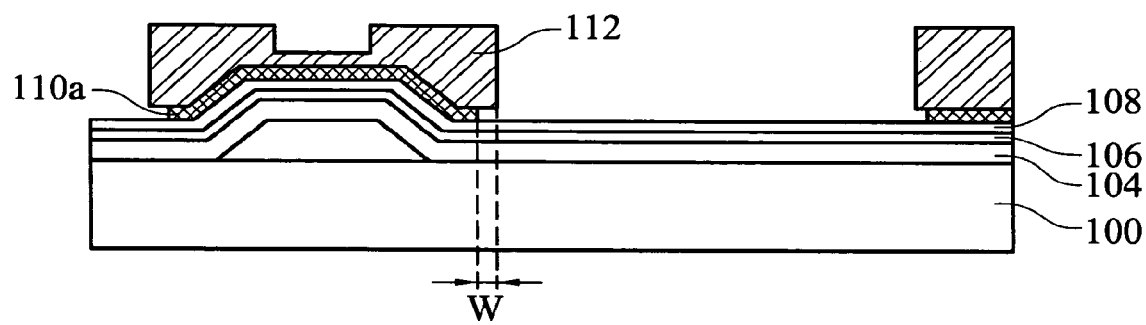

Referring to FIG. 2B, the second conducting layer 110 is wet etched using the resist layer 112 as an etching mask to form a patterned second conducting layer 110a with a first pattern. After wet etching, the edge of the second conducting layer 110a undercuts the resist layer 112, that is, the resist layer 112 overhangs the edge of the second conducting layer 110a. The edge of the second conducting layer 110a and that of the resist layer 112 is W, which is about 1 µm.

Figure 2C:
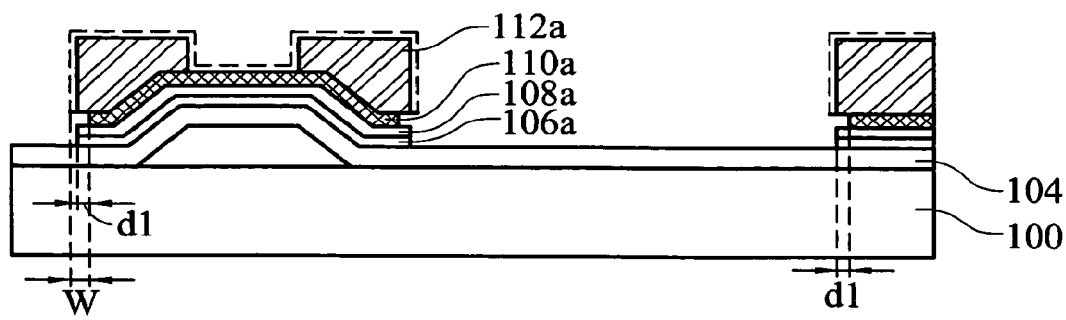

The semiconductor layer 106 and the doped semiconductor layer 108 are dry etched using the resist layer 112 as an etching mask. The etchant comprises oxygen ($O_2$) with a flow rate of about 100~1000 sccm. The resist layer 112 undergoes partial ashing during etching. After etching, the size of the resist layer 112 is reduced to form another resist layer 112a with a second pattern, i.e. a channel pattern, and the semiconductor layer 106a and the doped semiconductor layer 108a are formed. The edge of the semiconductor layer 106a and the doped semiconductor layer 108a are defined by the resist layer 112a, and the distance between the layers 108a/106a and the resist layer 112a is smaller than that of the second conducting layer 110a and the resist layer 112a. The distance between the layers 108a/106a and the second conducting layer 110a is $d_1$, as shown in FIG. 2C.

Figure 2D:
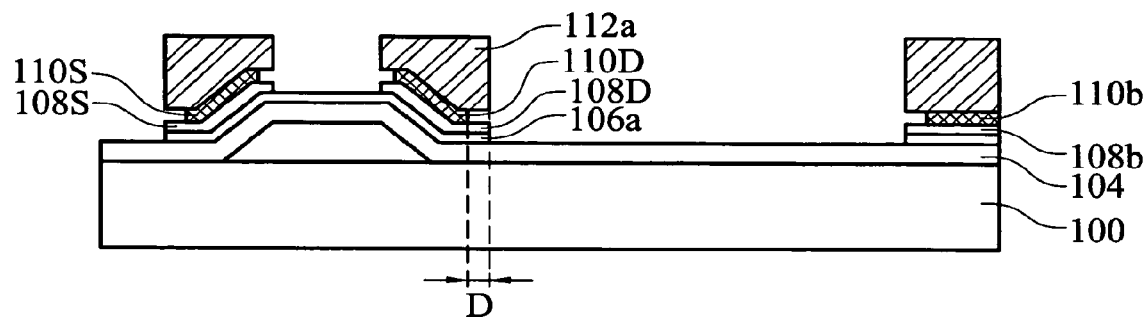
Figure 2E:
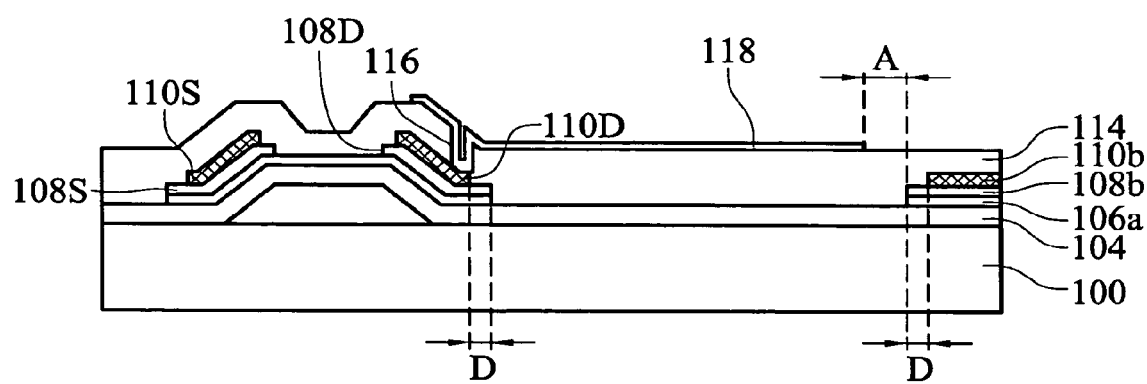

Referring to FIG. 2D, the second conducting layer 110a is wet etched again to become 110b, so that the edge of the second conducting layer 110b further undercuts the resist layer 112, that is, the resist layer 112 overhangs the edge of the second conducting layer 110b, and a source electrode 110S and a drain electrode 110D are defined in the second conducting layer 110b. The distance between the doped semiconductor layer 108a and the second conducting layer 110b increases from $d_1$ to D, and D is smaller than about 2 µm, preferably smaller than about 1.5 µm.

The resist layer 112a with the second pattern is used to dry etch the doped semiconductor layer 108a to define a source 108S and a drain 108D in the doped semiconductor layer 108b in the TFT region, therefore a TFT device is formed.

Referring to FIG. 2E, it is a cross section taken along II-II cut line of FIG. 1. After removing the resist layer 112a, an insulating layer 114 covers the entire substrate 100 with the TFT thereon. An opening 116 is formed in the insulating layer 114 to expose the surface of the drain electrode 110D. A pixel electrode 118 is formed on the insulating layer and contacts the drain electrode 110D through the opening 116. The material of the insulating layer 114 can be organic material, silicon oxide, silicon nitride or the same.

FIG. 1 is a top view of FIG. 2E. Because the distance D between the doped semiconductor layer 108b and the second conducting layer 110b is smaller than about 2 µm, the parasitic capacitance between the pixel electrode 118 and the doped semiconductor layer 108b is reduced. Therefore, distance A between the pixel electrode 118 and the data line DL can be further reduced to increase the aperture ratio.

As mentioned above, the present invention uses four etching processes to define the second conducting layer, the doped semiconductor layer and the semiconductor layer to form the source, drain and data line. The first etching process is a wet etching, and the second conducting layer is etched using the first resist layer as an etching mask. The second etching process is executed with an etchant comprising oxygen to etch the doped semiconductor layer and the semiconductor layer; the first resist layer undergoes ashing during etching; and a second resist layer with a channel pattern is formed by reducing the first resist layer after etching. The third etching process is another wet etching, and the second conducting layer is etched again using the second resist layer as the etching mask, so that the second conducting layer further undercuts the second resist layer and the source and drain electrodes are defined in the second conducting layer. The fourth etching process is executed to dry etch the doped semiconductor layer using the second resist layer as the etching mask, so that the source and drain are defined in the doped semiconductor layer. The edge of the second conducting layer undercuts the resist layer twice by wet etching, and the edge of the doped semiconductor layer and the semiconductor layer are near that of the second conducting layer by dry etching with etchant comprising oxygen. Therefore, the distance D between the edges of the doped semiconductor layer 108b and the second conducting layer 110b is reduced.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for forming a flat panel display, comprising:
   providing a substrate;
   forming a first conducting layer on the substrate, the first conducting layer comprising a gate electrode;
   covering a first insulating layer on the first conducting layer and the substrate;
   covering a semiconductor layer on the first insulating layer;
   covering a doped semiconductor layer on the semiconductor layer;
   covering a second conducting layer on the doped semiconductor layer;
   forming a first resist layer on the second conducting layer;
   performing a first wet etching on the second conducting layer such that the doped semiconductor layer is exposed and the first resist layer overhangs an edge of the second conducting layer, wherein a gap between the edge of the second conducting layer and edge of the first resist layer is a first distance;
   performing a first dry etching on the doped semiconductor layer and the semiconductor layer, wherein the first resist layer undergoes partial ashing to a second resist layer;
   performing a second wet etching on the second conducting layer such that the second resist layer overhangs the edge of the second conducting layer, wherein a gap between the edge of the second conducting layer and an edge of the doped semiconductor layer is a second distance, and a source electrode and a drain electrode are defined within the second conducting layer; and performing a second dry etching on the doped semiconductor layer to form a source and a drain within the doped semiconductor layer.

2. The method for forming the flat panel display of claim 1, wherein the first distance of the step of performing the first wet etching on the second conducting layer is about 1 µm.

3. The method for forming the flat panel display of claim 1, wherein the second distance of the step of performing the second wet etching on the second conducting layer is smaller than about 2 µm.

4. The method for forming the flat panel display of claim 1, wherein the doped semiconductor layer and the semiconductor layer of the step of performing the first dry etching are dry etched with the etchant comprising oxygen at a flow rate of about 100-1000 sccm.

5. The method for forming the flat panel display of claim 1, further comprising:

covering a second insulating layer on the second conducting layer, the doped semiconductor layer, the semiconductor layer and the first insulating layer;

forming an opening within the second insulating layer to expose a portion of the drain electrode; and forming a pixel electrode on the second insulating layer and the pixel electrode connecting with the drain electrode via the opening.

6. The method for forming the flat panel display of claim 1, wherein the semiconductor layer of the step of covering a semiconductor layer on the first insulating layer is an amorphous layer.

7. The method for forming the flat panel display of claim 1, wherein the doped semiconductor layer of the step of covering a doped semiconductor layer on the semiconductor layer is an n-type doped amorphous silicon layer.

8. The method for forming the flat panel display of claim 1, wherein a size, which is of the second resist layer of the step of performing the first dry etching on the doped semiconductor layer and the semiconductor layer, is smaller than a size of the first resist layer.

9. The method for forming the flat panel display of claim 1, wherein material of the first insulating layer of the step of covering the first insulating layer on the first conducting layer and the substrate comprises organic material, silicon oxide or silicon nitride.

10. The method for forming the flat panel display of claim 5, wherein material of the second insulating layer of the step of covering the second insulating layer on the second conducting layer, the doped semiconductor layer, the semiconductor layer and the first insulating layer comprises organic material, silicon oxide or silicon nitride.

* * * * *